US012719414B2

(12) United States Patent
Ghanevati et al.

(10) Patent No.: US 12,719,414 B2
(45) Date of Patent: Aug. 25, 2026

(54) LOW NOISE AMPLIFIER WITH POST DISTORTION CIRCUIT

(71) Applicant: Northrop Grumman Systems Corporation, Falls Church, VA (US)

(72) Inventors: Manouchehr Ghanevati, Redondo Beach, CA (US); Kevin M. Leong, Redondo Beach, CA (US); Mansoor K. Siddiqui, Redondo Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 499 days.

(21) Appl. No.: 18/215,439

(22) Filed: Jun. 28, 2023

(65) Prior Publication Data

US 2025/0007468 A1 Jan. 2, 2025

(51) Int. Cl.
*H03F 1/32* (2006.01)
*H03F 3/19* (2006.01)

(52) U.S. Cl.
CPC ................. *H03F 1/32* (2013.01); *H03F 3/19* (2013.01); *H03F 2200/294* (2013.01); *H03F 2200/451* (2013.01)

(58) Field of Classification Search
CPC ........ H03F 1/32; H03F 3/19; H03F 2200/294; H03F 2200/451
USPC .......................................................... 330/291
See application file for complete search history.

(56) References Cited

U.S. PATENT DOCUMENTS

| | | | | |
|---|---|---|---|---|
| 5,481,389 | A * | 1/1996 | Pidgeon | H04B 10/2933 398/208 |
| 7,853,235 | B2 * | 12/2010 | Aparin | H03F 1/301 455/295 |
| 2008/0242257 | A9 * | 10/2008 | Aparin | H03F 1/301 455/341 |

FOREIGN PATENT DOCUMENTS

| | | | | |
|---|---|---|---|---|
| CN | 106788278 B | * 12/2020 | | H03F 3/19 |
| EP | 4418535 A1 | * 8/2024 | | H03F 3/245 |
| WO | WO 94/09574 | 4/1994 | | |

OTHER PUBLICATIONS

How to Characterize CATV Amplifiers Effectively Using the HP 4396B RF Network/Spectrum/Impedance Analyzer, Application Note 1288-4, © Copyright 1997, Hewlett-Packard Company (Year: 1997).*

CATV QAM Channel Center frequency Annex B, 6 MHz Channels—54 to 1002 MHz, Toner, 969 Horsham Road, Horsham, OA 19044 USA (Year: 2018).*

(Continued)

*Primary Examiner* — Hafizur Rahman
(74) *Attorney, Agent, or Firm* — Dority & Manning, P.A.

(57) ABSTRACT

An exemplary RF amplifier circuit has a LNA with its output coupling RF signals to a load. A post distortion (PD) circuit having a semiconductor device with a control gate biased to cause the semiconductor device to operate in a nonlinear region at or near pinch-off that is coupled to the output of the LNA. The PD circuit generates at least one PD intermodulation product at the PD port in response to the RF signals being received from the LNA through the coupling. The at least one PD intermodulation product being out of phase to an intermodulation product produced by the LNA that is present at the output. The at least one PD intermodulation product combining with the intermodulation product produced by the LNA to cause a reduction of the intermodu- (Continued)

lation product at the load by at least several dB for at least one frequency in the range of frequencies.

19 Claims, 16 Drawing Sheets

(56) References Cited

OTHER PUBLICATIONS

International Search Report and Written Opinion issued in connection with International Patent Application No. PCT/US2024/034024 and dated Oct. 15, 2024, 17 pages.
Kevin W Kobayashi, "Bias optimized IP2 & IP3 linearity and NF of a decade-bandwidth GaN MMIC Feedback Amplifier", 2012 IEEE Radio Frequency Integrated Circuits Symposium (RFIC), Montreal, QC, Canada, Jun. 17-19, 2012, IEEE, Piscataway, NJ, USA, Jun. 17, 2012, pp. 479-482.
Varonen Mikko et al: "An MMIC Low-Noise Amplifier Design Technique", IEEE Transactions On Microwave Theory and Techniques, IEEE, USA, vol. 64, No. 3, Mar. 3, 2016, pp. 826-835.
Yoon Youngchang et al: "A Highly Linear 28GHz 16-Element Phased-Array Receiver with Wide Gain Control for 5G NR Application", 2019 IEEE Radio Frequency Integrated Circuits Symposium (RFIC), IEEE, Jun. 2, 2019, pp. 287-290.
Sangwon KO, "Linerization Techniques for Integrated CMOS Power Amplifiers and A High Efficiency Class-F GaN Power Amplifier", A Dissertation Presented to the Graduate School of the University of Florida in Partial Fulfillment of the Requirements for the Degree of Doctor of Philosophy, University of Florida, 2007, pp. 1-140.
Manou Ghanevati, "Fundamentals of RF and Microwave Circuit Design, Practical Analysis and Design Tools", Third Edition, p. 455, 2023.

* cited by examiner

-0.00008

500
510
505
VG
215
205
Rbias_PD
D
210
S
520
L
VG2
220
C
525
R_VG2
R
R_FB
C_F8
C_VG2
ATTN1
ATTN2
D2
CC_out
L_mn1
L_mn2
CC1
CC2
C_par
Q2
G2
RLo.
S2
D1
CC_in
G1
L_bias
L_MATCH
225
230
Q1
Rs
R_VG1
S1
VD
c_bpin
R_bp1
Vs
VG1
515
C_bp1

| HARMINDEX | HB. FREQ |
|---|---|
| 0 | 0.000000 Hz |
| 1 | 7.00000 MHz |
| 2 | 14.0000 MHz |
| 3 | 1.98950 GHz |
| 4 | 1.99650 GHz |
| 5 | 2.00350 GHz |
| 6 | 2.01050 GHz |
| 7 | 3.99300 GHz |
| 8 | 4.00000 GHz |
| 9 | 4.00700 GHz |
| 10 | 5.99650 GHz |
| 11 | 6.00350 GHz |
| 12 | 8.00000 GHz |

| HARMINDEX | HB. FREQ |
|---|---|
| 0 | 0.000000 Hz |
| 1 | 7.00000 MHz |
| 2 | 14.0000 MHz |
| 3 | 1.98950 GHz |
| 4 | 1.99650 GHz |
| 5 | 2.00350 GHz |
| 6 | 2.01050 GHz |
| 7 | 3.99300 GHz |
| 8 | 4.00000 GHz |
| 9 | 4.00700 GHz |
| 10 | 5.99650 GHz |
| 11 | 6.00350 GHz |
| 12 | 8.00000 GHz |

| HARMINDEX | HB. freq |
|---|---|
| 0 | 0.000000 Hz |
| 1 | 7.00000 MHz |
| 2 | 14.0000 MHz |
| 3 | 1.98950 GHz |
| 4 | 1.99650 GHz |
| 5 | 2.00350 GHz |
| 6 | 2.01050 GHz |
| 7 | 3.99300 GHz |
| 8 | 4.00000 GHz |
| 9 | 4.00700 GHz |
| 10 | 5.99650 GHz |
| 11 | 6.00350 GHz |
| 12 | 8.00000 GHz |

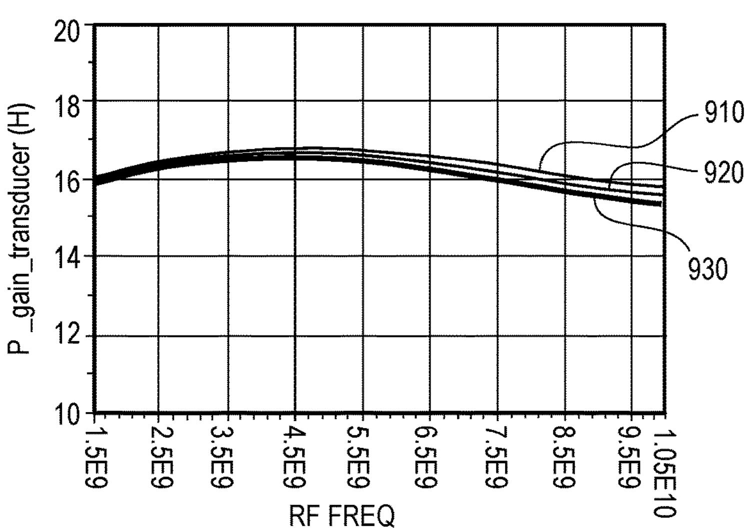
FIG. 9A
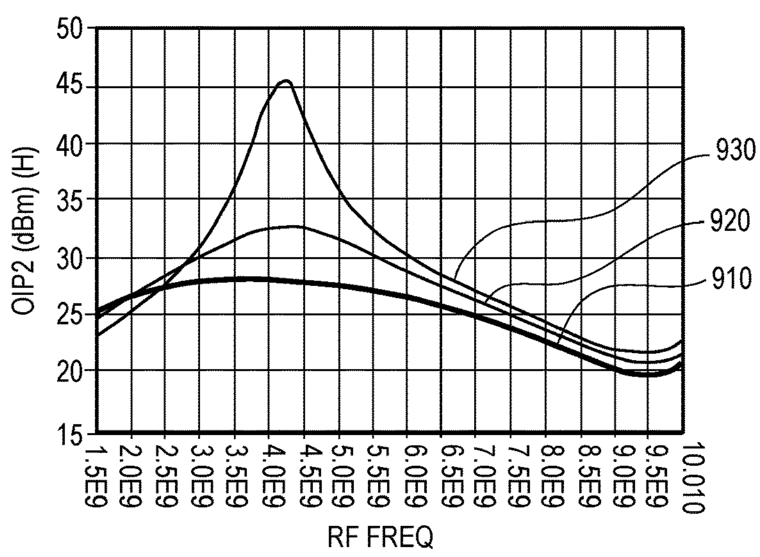
FIG. 9B
FIG. 9C

OIP2 VS. GATE VOLTAGE
(LNA WITH POST DISTORTION)

60
50
40
30
20
10
0
OIP2, HIGH (dBm)
1820
1810
VG= -2V, VD = 1.5V, VG2 = 0.75V, ID = 25mA
VG= -0.08V, VD = 1.5V, VG2 = 0.75V, ID = 25mA
1.5
2
2.5
3
3.5
4
FUNDAMENTAL FREQ. (GHZ)

LOW NOISE AMPLIFIER WITH POST DISTORTION CIRCUIT

BACKGROUND

Embodiments of the invention relate to low noise amplifiers (LNA) and in particular to LNAs where low second-order intermodulation products (IM2) are desired in order to meet stringent linearity requirements.

LNAs which operate in the gigahertz region and have high linearity requirements present significant challenges. These challenges can be exacerbated where the LNA is required to operate with low DC power consumption. Some technologies, e.g., Indium Phosphide (InP) and Indium Arsenide Composite Channel (IACC), are especially challenging when operated at low DC power. LNAs are often required to meet high standards for minimized second order intermodulation products (IM2) over a desired band of operation in order to achieve a desired level of linearity.

There exists a need for an LNA with minimized IM2 products in order to provide an improved second order intercept point (IP2) and enhanced linearity.

SUMMARY

It is an object of embodiments of the present invention to provide an improved LNA with minimized IM2 products in order to provide high linearity, with emphasis on improving second-order intercept point (e.g., IP2).

It is a further object of embodiments of the present invention to provide a post distortion circuit that operates in conjunction with an LNA to minimize IM2 products at the output of the LNA.

An exemplary RF amplifier circuit has a LNA with its output coupling RF signals to a load. A post distortion (PD) circuit having a semiconductor device with a control gate biased to cause the semiconductor device to operate in a nonlinear region at or near pinch-off that is coupled to the output of the LNA. The PD circuit generates at least one PD intermodulation product at the PD port in response to the RF signals being received from the LNA through the coupling. The at least one PD intermodulation product being out of phase to an intermodulation product produced by the LNA that is present at the output. The at least one PD intermodulation product combining with the intermodulation product produced by the LNA to cause a reduction of the intermodulation product at the load by at least by several dB for at least one frequency in the range of frequencies. In another embodiment, a PD circuit is coupled to the output of an LNA to cause a reduction of at least one intermodulation product of the LNA at the load.

In a further embodiment, an LNA utilizes a complementary pair of semiconductor devices Q1 and Q2 for amplification. Q1 and Q2 are biased so that the DC quiescent voltages across each are not equal causing a reduction of the second intermodulation product produced by Q1 and Q2 as compared with a second intermodulation product produced by Q1 and Q2 operating with equal DC quiescent voltages.

DESCRIPTION OF THE DRAWINGS

Features of exemplary embodiments of the invention will become apparent from the description, the claims, and the accompanying drawings in which:

FIG. 9A is a graph of gain versus frequency for an LNA with post distortion circuit as shown in FIG. 4 with 3 curves corresponding with 3 different values of a characteristic;

FIG. 9B is a graph of OIP2 versus frequency for an LNA with post distortion circuit as shown in FIG. 4 where the 3 curves correspond respectively with the 3 different values associated with FIG. 9A;

FIG. 9C is a graph of OIP3 versus frequency for an LNA with post distortion circuit as shown in FIG. 4 where the 3 curves correspond respectively with the 3 different values associated with FIG. 9A;

DETAILED DESCRIPTION

One aspect of the present invention resides in the recognition that a nonlinear circuit coupled the output of an LNA could be utilized to provide cancellation of IM2 products generated by the LNA. "OIPx" refers to the x order output intercept point; and the "IMx" refers to. x order intermodulation products.

Another aspect of the present invention resides in the further recognition that such a nonlinear circuit could be coupled to the output of the LNA without consuming any DC power from the LNA. Consistent with these aspects, a significant improvement in observed OIP2 at the output of the LNA resulting from the suppression of IM2 is achieved using a post distortion circuitry in accordance with the present invention without adversely impacting the noise figure (NF) and DC power consumption of the LNA.

Figure 1:
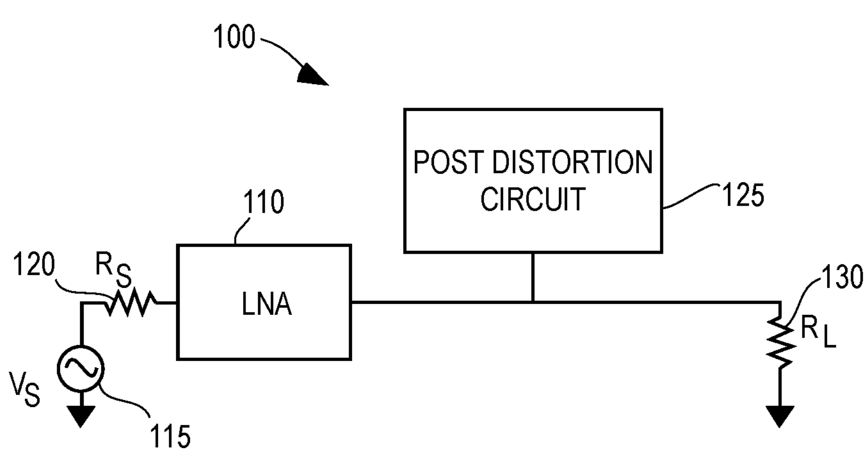
FIG. 1 shows an embodiment of the present invention with a post distortion circuit connected to the output of an LNA.

FIG. 1 shows an embodiment 100 of the present invention with low noise amplifier (LNA) 110 receiving an RF input from an input circuit modeled as RF voltage generator 115 that has an equivalent resistance 120. A post distortion circuit (PD) 125 is connected to the output of the LNA 110 along with a circuit that receives the output from the LNA, modeled as load resistance 130. As an example, the LNA 110 may serve as a broadband low power preamplifier as part of an RF receiver operating in the gigahertz range. For the receiver example, the input signal 115 may be coupled from an antenna and the circuitry 130 receiving the output from the LNA is another circuit in the RF receiver. Of course, this is merely illustrative of one example of several different applications for an LNA.

Figure 2:
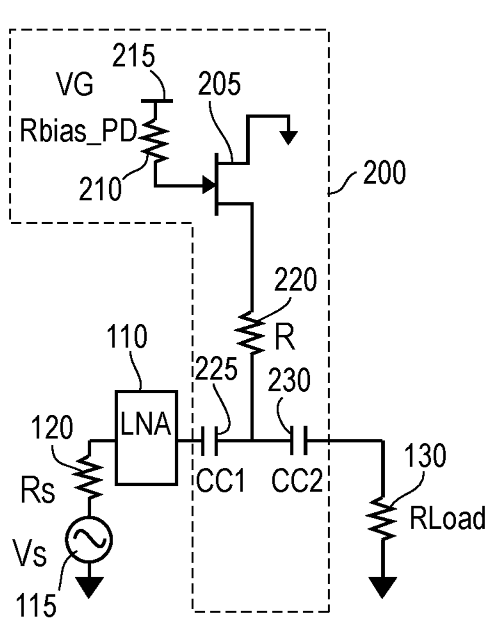
FIG. 2 shows an exemplary embodiment of a post distortion circuit in accordance with the present invention.

FIG. 2 is an exemplary embodiment of a post distortion circuit (PD) 200 in accordance with the present invention with the other elements as described in FIG. 1. An active semiconductor device 205, e.g. a field effect transistor, capable of operating in a nonlinear amplification region is in this example a FET having a drain connected to ground and a gate connected through biasing resistor 210 to a DC gate biasing voltage source VG 215. The source of the FET 205 is connected through resistor 220 to the output of LNA 110 through capacitor 225 and to the equivalent load 130 through capacitor 230. Preferably, capacitors 225 and 230 are selected to have a sufficiently large value of capacitance so that each offers no significant impedance at the desired frequencies of operation, e.g. in the gigahertz range. The point of connection of capacitors 225 and 230 with resistor 220 serves as a mixer for the output of the LNA 110 and the output associated with FET 205.

Figure 3:
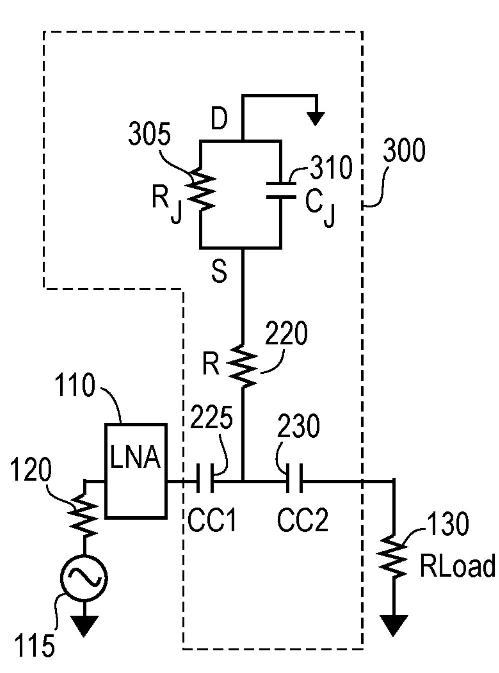
FIG. 3 shows the post distortion circuit of FIG. 2 as an equivalent circuit.

FIG. 3 is another representation of the PD circuit 200 is shown in FIG. 2 in which device 205 as viewed from its source terminal is modeled as a nonlinear resistor 305 in parallel with capacitor 310, both connected to ground. This model is due to the configuration and biasing of device 205. As a result of being connected to the RF path of the output of the LNA 110 between the 2 DC blocking capacitors 225 and 230, no DC current can be drawn by device 205 since there is no DC path to ground. The nominal VDS across device 205 is zero since the drain of the device is grounded and the source is blocked from any DC path.

The device 205 may be embodied as a small high electron mobility transistor (HEMT) and may use the same technology as the active devices in the LNA 110. The gate voltage of device 205 as controlled by source 215 is selected to be close to pinch-off voltage where the device exhibits high nonlinearity. The RF output power of the LNA 110 promotes the nonlinear operation of the device 205 and hence of PD circuit 200. The ratio of the AC voltage through device 205 divided by the AC current through device 205 resulting from the RF output power from the LNA 110 causes device 205 to function as a nonlinear resistor 305. The junction between the drain and source of device 205 acts as a variable capacitor 310. The currents from each of the LNA 110 and the PD circuit 200 contains harmonics and intermodulation products that partially cancel each other after combining together at the load 130. The gate voltage source 215 is responsible for setting the gate voltage to a voltage near pinch-off voltage of device 205 which defines the degree of nonlinear operation of device 205. The amount of gate voltage bias, the level of RF power from the LNA 110, and the size of device 205 (semiconductor area which assists in determining gain) determine the values of the nonlinear junction resistor 305 and the value of the capacitor 310. The resistor 220 affects the operating point of device 205 and is responsible for the degree of coupling between the LNA 110 RF path and the device 205. As will be discussed in more detail with regard to FIG. 4, an inductor in series with resistor 220 and a capacitor in parallel with resistor 220 can be further utilized to shape the frequency response of the PD circuitry 200.

An analysis of the PD circuit 300 modeled in FIG. 3 follows and is provided to assist in better understanding its operation. Assuming that DC coupling capacitors CC1 225 and CC2 230 are large enough to act as short circuits at the desired frequencies of operation, the following can be written with respect to the PD circuit 300 of FIG. 3 with LNA 110 assumed to be a short circuit for this analysis:

$$
\begin{aligned}
V_2 &= V_{Load} \\
&= \frac{V_s Z_{in}}{Z_{01} + Z_{in}} \\
&= \frac{V_s\{Z_{02}[1 + R(\alpha_1 + j\alpha_2)]\}}{Z_{01}\{(R + Z_{02})(\alpha_1 + j\alpha_2) + 1\} + Z_{02}[1 + R(\alpha_1 + j\alpha_2)]} \\
&= \frac{V_s\{Z_{02}[1 + R(\alpha_1 + j\alpha_2)]\}}{Z_{01}\alpha_1(R + Z_{02}) + Z_{01} + Z_{02} + Z_{02}(R\alpha_1) + j[Z_{01}\alpha_2(R + Z_{02}) + Z_{02}(R\alpha_1)]}
\end{aligned}
$$

where, $$\alpha_1 = \frac{1}{r_j}$$

$\alpha_2 = \omega C_j$ $R_S = Z_{01}$ $R_{LOAD} = Z_{02}$ $Z_{PD}$=Impedance of the post distortion circuitry including series resistor R $$
Z_{in} = Z_{02} \| Z_{PD} = \frac{Z_{02}\left[R + \frac{1}{\frac{1}{r_j} + j\omega C_j}\right]}{R + \frac{1}{\frac{1}{r_j} + j\omega C_j} + Z_{02}}
$$

Assuming $Z_{01}=Z_{02}=Z_0$, and after dividing by $Z_0$, it can be written:

$$
\begin{aligned}
V_2 &= \frac{V_s\{[1 + R(\alpha_1 + j\alpha_2)]\}}{\alpha_1(R + Z_0) + 1 + 1 + (R\alpha_1) + j[\alpha_2(R + Z_0) + (R\alpha_1)]} \\
&= \frac{V_s\{[1 + R(\alpha_1 + j\alpha_2)]\}}{\alpha_1(2R + Z_0) + 2 + j[\alpha_2(R + Z_0) + (R\alpha_1)]}
\end{aligned}
$$

For the distortion circuit as a two-port network, it can be written:

$$
S_{21} = \frac{V_2}{\frac{V_s}{2}} = \frac{2[1 + R(\alpha_1 + j\alpha_2)]}{\alpha_1(2R + Z_0) + 2 + j[\alpha_2(R + Z_0) + (R\alpha_1)]}
$$

When R=0, S21 (forward voltage gain) reduces to $$S_{21} = \frac{2}{\alpha_1 Z_0 + 2 + j[\alpha_2 Z_0]}$$

Thus, $$|S_{21}| = \frac{2}{\sqrt{(\alpha_1 Z_0 + 2)^2 + (\alpha_2 Z_0)^2}} = \frac{2}{\sqrt{\left(\frac{1}{r_j} Z_0 + 2\right)^2 + (\omega C_j Z_0)^2}}$$

$$\angle S_{21} = \tan^{-1}\left[-\frac{\alpha_2(Z_0)}{\alpha_1(Z_0) + 2}\right] = \tan^{-1}\left[-\frac{\alpha_2}{\alpha_1 + \frac{2}{Z_0}}\right] = \tan^{-1}\left[-\frac{\omega C_j}{\frac{1}{r_j} + \frac{2}{Z_0}}\right]$$

Several observations about the forward voltage gain can be made with respect to above equations:

1) Magnitude of $S_{21}$ decreases with increase in frequency, as expected.

2) Magnitude of $S_{21}$ also depend on both $r_j$ and $C_j$.

3) Phase of $S_{21}$ is negative and increases with increase in frequency.

Dividing the numerator and denominator in by R in the $S_{21}$ equation, it can be written:

$$S_{21} = \frac{2\left[\frac{1}{R} + (\alpha_1 + j\alpha_2)\right]}{\alpha_1\left(2 + \frac{Z_0}{R}\right) + \frac{2}{R} + j\left[\alpha_2\left(1 + \frac{Z_0}{R}\right) + (\alpha_1)\right]}$$

Since R>>1 (or 2), this equation simplifies to:

$$S_{21} \approx \frac{2[(\alpha_1 + j\alpha_2)]}{\alpha_1\left(2 + \frac{Z_0}{R}\right) + j\left[\alpha_2\left(1 + \frac{Z_0}{R}\right) + (\alpha_1)\right]} = \frac{2\left[\frac{1}{r_j} + j\omega C_j\right]}{\frac{1}{r_j}\left(2 + \frac{Z_0}{R}\right) + j\left[\omega C_j\left(1 + \frac{Z_0}{R}\right) + \left(\frac{1}{r_j}\right)\right]}$$

Although the resistor R 220 can contribute to the biasing point of the PD circuitry, it has a very pronounced effect of $S_{21}$ above. As R 220 increases, magnitude of $S_{21}$ increases. Therefore, when R 220 increases substantially, the PD circuitry is decoupled from the LNA amplifier 110. When R 220 is small in value, the insertion loss is higher, but this means that intermodulation products generated by the non-linear PD circuit are also stronger.

Figure 4A:
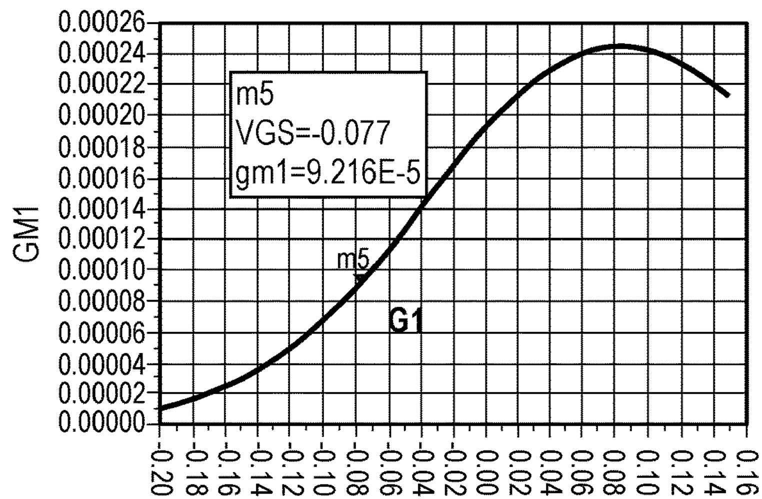
FIGS. 4A-4C are graphs showing exemplary gains associated with intermodulation products produced by the post distortion circuit.
Figure 4B:
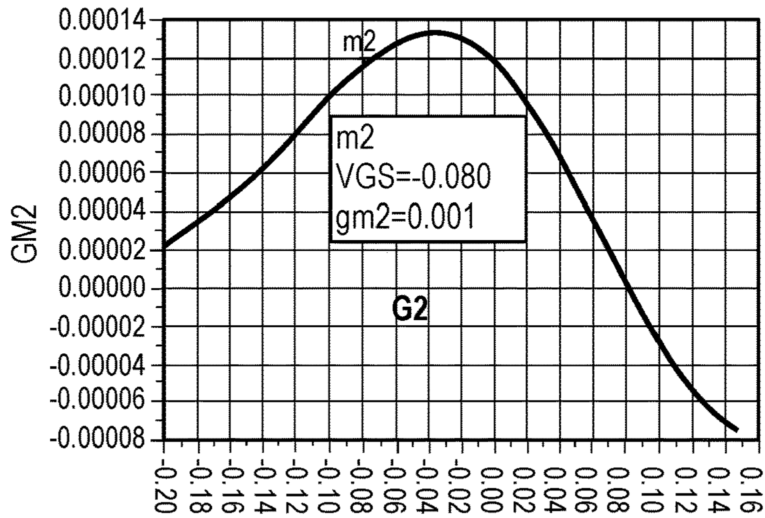
Figure 4C:
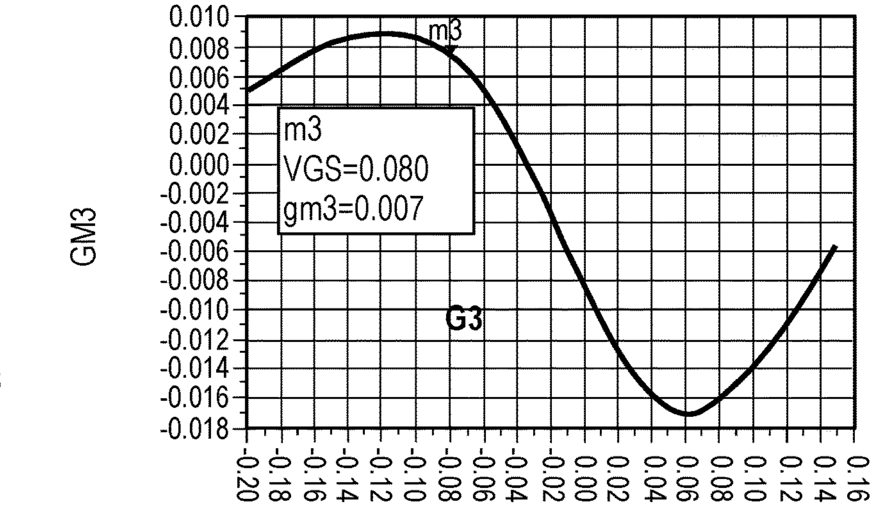

FIGS. 4A-4C are graphs showing exemplary derivative of transconductance plots g1, g2 and g3, respectively, versus gate voltage associated with the model PD circuit 300. Selection of the DC operating point of device 205 is important to establishing nonlinear operation and generation of harmonics and intermodulation products, as depicted in FIGS. 4A-4C. The active device used in the PD circuit is intentionally biased to operate in the "nonlinear" region for the active device. For an active semiconductor device, operation in either a saturation region or a cutoff (pinch-off) region would represent nonlinear regions. In the case in the PD circuit, the PD circuit transistor is biased at or near pinch-off, where drain current is negligible or close to zero [

The current in the PD circuitry 200 may be approximated as a combination of the g1, g2 and g3 gains:

$$i_{PD} = g_1 v_{gs} + g_2 v_{gs}^2 + g_3 v_{gs}^3$$

where, $$g_1 = C1\frac{\partial i_D}{\partial(Vgs)},\ g_2 = C2\frac{\partial^2 i_D}{\partial(V^2 gs)},\ g_3 = C3\frac{\partial^3 i_D}{\partial(V^3 gs)}$$

and C1, C2, C3 are constants.

The intermodulation products (IM2 and IM3) are proportional to $g_2$ and $g_3$, respectively. Furthermore, the strength of nonlinearity products produced by PD circuit 200 depends on $V_{gs}$ of device 205 and its DC operating (bias) point. Therefore, below the statements can be said:

- IP2/IP3 trade-offs can be made by selection of the non-linear region bias point.
- IM2/IM3 are proportional to g2/g3.
- Amount of IM2/IM3 generation can be accomplished by:
  - Adjusting device gate voltage (bias point selection)
  - Adjusting device size (overall device gain)
  - Adjusting the RF drive from the LAN Since the goal of linearization is for the PD circuitry to cancel out the LNA's more impacting intermodulation products (IM2 and to a lesser extend IM3) at the load, the characteristics of the PD circuitry 200 influencing its generation of IM2 and IM3 products need to be considered.

Figure 6:
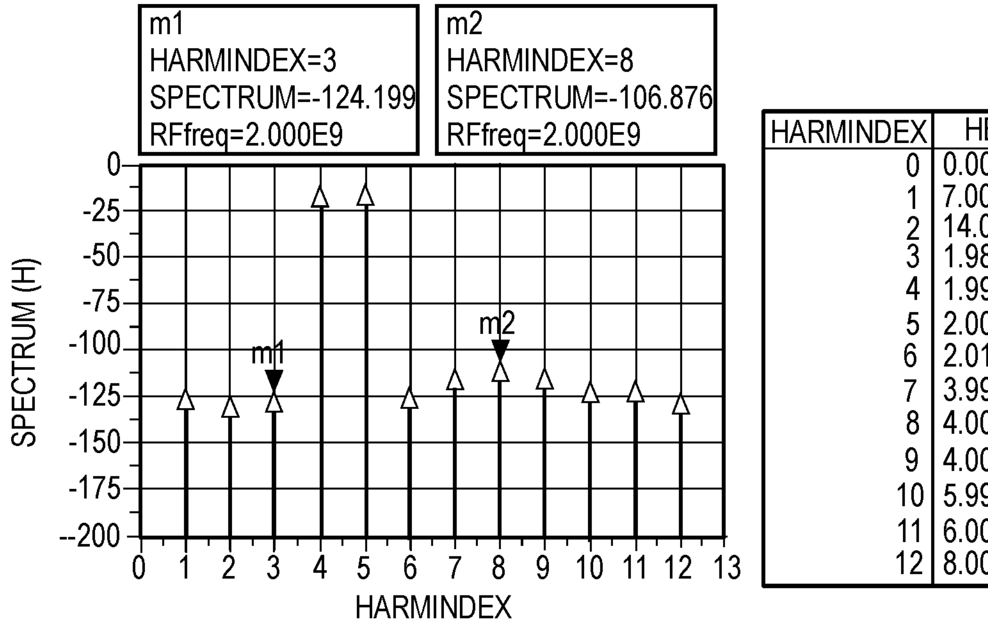
FIGS. 6, 7 and 8 are graphs representing a two-tone test spectrum of the post distortion circuit operated with different $V_{gs}$ of the active device of the post distortion circuit.
Figure 7:
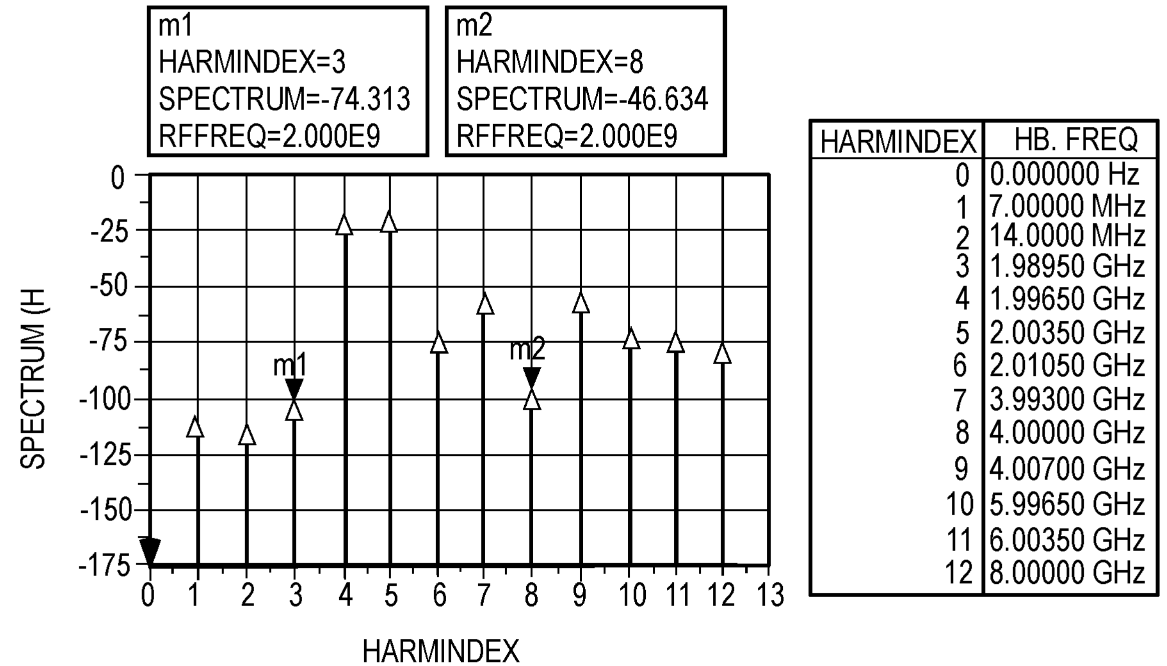
Figure 8:
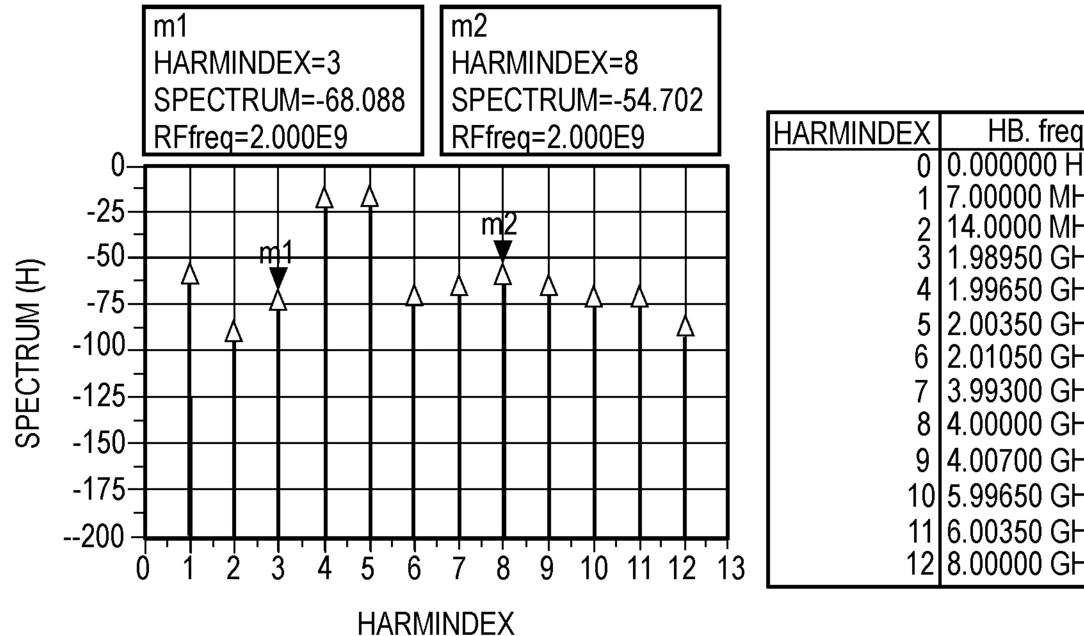

FIGS. 6, 7 and 8 are graphs representing a two-tone test spectrum of the post distortion circuit operated with different Vgs of the active device. To demonstrate nonlinear behavior of the PD circuitry as a function Vgs and RF drive, consider schematic diagram of FIG. 2. The circuit 200 uses ideal DC blocking capacitors 225 and 230, and it is subjected to two-tone test. Device nonlinear model has a total periphery of 20 um for the purpose of this test. The frequency separation between tones (Δf) is 7 MHz. Therefore, at an RF frequency of 2 GHz, frequency tones are $$F_{RF} \pm \frac{\Delta f}{2} = 2\text{ GHz} \pm \frac{0.007}{2}.$$

Thus, $f_1$=1996.5 MHz and $f_2$=2003.5 MHz. As a result, frequency of some of IM3/IM2 products ($2f_1-f_2$ and $f_1+f_2$) fall at 1989.5 MHz and 4000 MHz, as indicated by markers 1 and 2 respectively in FIGS. 6-8. At Vgs=−2V as in FIG. 6, the device 205 is in pinch-off mode and the device is effectively "turned off" for all RF drive levels (−10 dBm to −30 dBm) potentially produced by the exemplary LNA. This contrasts with FIGS. 7 and 8 where strong IM2/IM3 products are generated by device 205 biased at Vgs=−0.08V and −0.15V, respectively, for RF drive of −10 dBm from the LNA. A comparison between FIGS. 7 and 8 shows that strength of IM2 and IM3 products produced by the device 205 can be adjusted by its gate voltage. Therefore, trade-offs between the levels of IP2 and IP3 produced by the device 205 and used for cancellation can be accomplished by controlling and adjusting Vgs.

Figure 5:
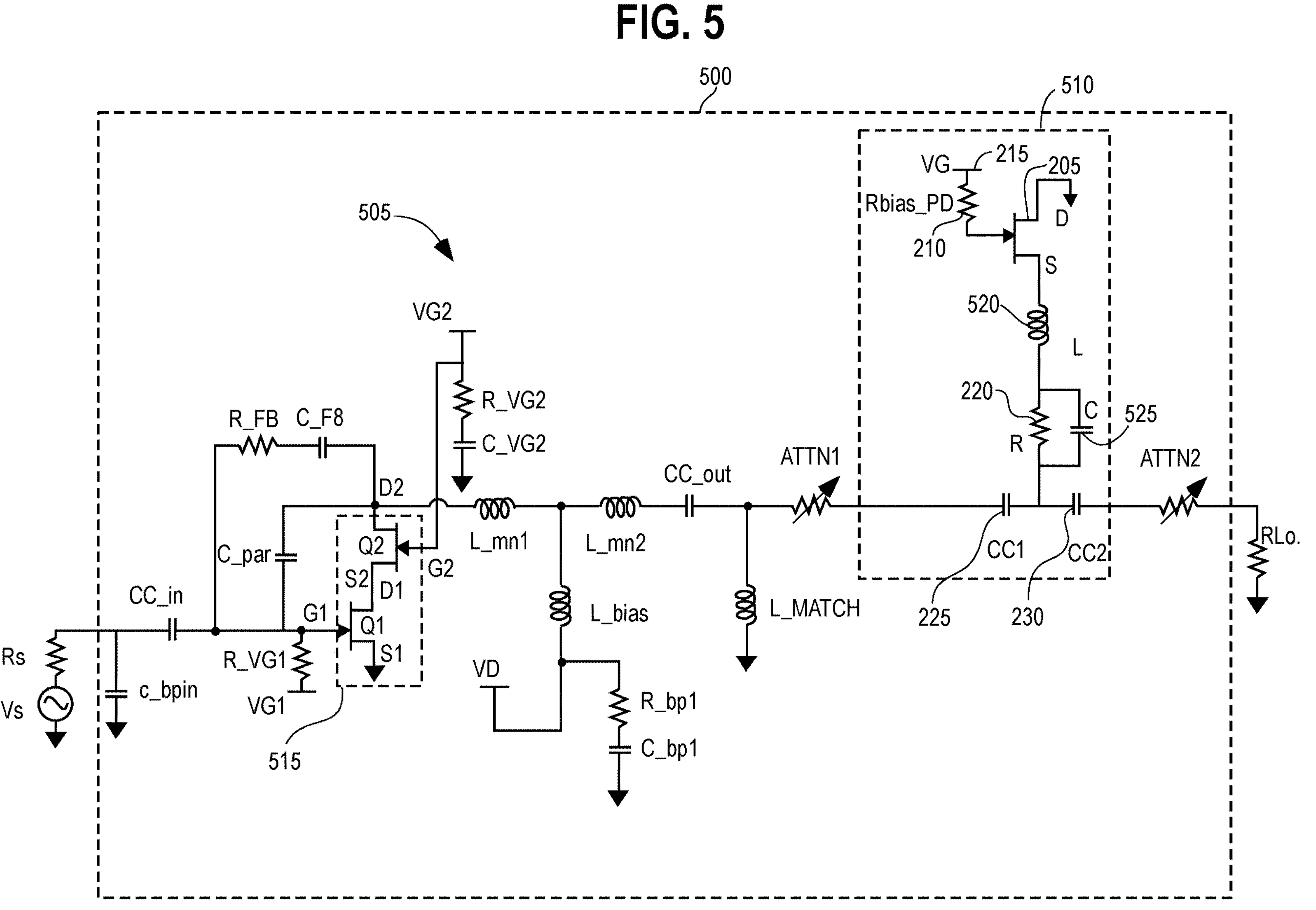
FIG. 5 shows a schematic diagram of an embodiment of the present invention in accordance with FIG. 1.

FIG. 5 is a schematic diagram of a circuit 500 of an LNA 505 with its output coupled to PD circuit 510 in accordance with the block diagram of FIG. 1. Circuit 500 may be constructed as a monolithic microwave integrated circuit (MMIC) consistent with construction practices were circuitry operating in the gigahertz region, e.g. 1-10 GHz. In this example, a dual gate active device 515, e.g. HEMT FETs, consists of Q1 and Q2, and provides the gain block for the LNA 505. The capacitor C_par represents the parasitic capacitance between the gate of Q1 and the drain of Q2, which may be on the order of 6-8 femtofarads (fF). An RC network of R_fb and C_fb functions as a feedback network for device 515 to shape the frequency response, provide matching, and add stability. A DC bias source VG1 provides bias for the gate of Q1 through resistor R_VG1; a DC bias source VG2 provides biasing for the gate of Q2. The RC network R_VG2 and C_VG2 contributes to stability and frequency selectivity for the LNA 505. A DC voltage source VD provides biasing through a radio frequency choke (L_bias) to the drain of Q2. The RC network R_bp1 and C_bp1 contributes to the frequency stability of the LNA 505. The capacitors CC_in and CC_out function is DC blocking capacitors while providing negligible at the frequency of operation. The input bypass capacitor C_bpin contributes to a reduction of undesired out-of-band gain and assists with input matching. The inductors L_mn1, L_mn2 and L_match provide a matching network and assists in shaping a desired frequency response. The variable resistors ATTN1 and ATTN2 contributes to improving output return loss and frequency stability.

The PD circuit 510 is biased by DC voltage source VG 215 through bias resistor Rbias_PD 210 at the gate of the device 215. The value for the biasing resistor can be optimized for desired overall frequency response as will be described below. The PD circuit interfaces with main LNA RF path through resistor R 220, inductor L 520 and capacitor C 525. The resistor R 220 primarily controls the degree of coupling between the PD circuit and LNA circuits. Resistor 220 also contributes to DC operating condition of device 205. The inductor L 520 and capacitor C 525 contribute to desired frequency response that affects intermodulation products of the device 205, as well as linearity versus frequency. Variations, especially in the reduction of overall IP2 products, due to different values of L 520 and C 525 are illustrated by graphs below. The capacitors CC1 225 and CC2 230 are DC blocking capacitors that prevent DC current flow between the PD circuit 510 and the LNA circuit 505. Ideally, these capacitors should be large enough to act as an ac short at operating frequency range of interest. These capacitors can be realized as on-chip MIM caps. These capacitors could be about 14 pF for operating frequencies in the 1-10 GHz range. Alternatively, discrete off-chip capacitors can be used.

In certain applications slightly lower IP3 performance can be traded for higher IP2 performance, where IP2 is the overall limiting factor in LNA performance. Any nonlinearity tradeoffs or distortion schemes should preferably not adversely affect the LNA's noise figure (NF) performance and overall frequency response.

FIGS. 9A, 9B and 9C are three respective graphs of gain, OIP2, OIP3 versus frequency for circuit 500, i.e., an LNA 505 with PD circuit 510 as shown in FIG. 5. For each of the 3 curves in each graph, R=100 ohms and Q (device 205 area)=30 um. However, Vgs for device 205 is −0.2V for curve 910, −0.15V for curve 920 and −0.1V for curve 930. As will be seen from the graph of FIG. 9A, the gain for each of the 3 different bias voltages is very similar, i.e. around 16, over the range 1.5 GHz-10 GHz. However, as will be seen in FIG. 9B, the values of OIP2 are substantially different for the 3 different bias conditions. For FIGS. 9-14, the values in FIG. 5 are: R=100 ohms, L=0.26 nH, C=30 fF. In FIG. 9B curve 910 representing Vgs=−0.2 V is the closest of the 3 bias voltages to pinch-off which results in the worst (highest) OIP2 values. Curve 930 representing Vgs=−0.1 V which is still in the nonlinear region for device 205 results in better performance (lower) OIP2. Contrasting the values of curves 910 and 930 at approximately 4 GHz, curve 930 with the value of about −47 dBm shows much better performance (lower OIP2) compared with curve 910 which is a value of about −28 dBm. As will be seen in FIG. 9C, corresponding curve 930 shows that across the frequency range OIP3 is approximately 6 dBm worse (higher) compared to corresponding values for curve 910. This illustrates a trade-off of moderately worse OIP3 performance for a very substantial improvement in performance of OIP2. Since OIP2 performance may have a substantially greater impact in linearity as compared to OIP3 performance, such a trade-off will yield a better overall linearity performance of the circuit 500.

FIGS. 10A-10C, 11A-11C, 12A-12C, 13A-13C, and 14A-14C correspond respectively to FIGS. 9A-9C where the 3 curves in each graph correspond respectively with 3 different values. The Y-axis and X-axis for each of the respective graphs represent gain, OIP2 and OIP3.

Figure 10A:
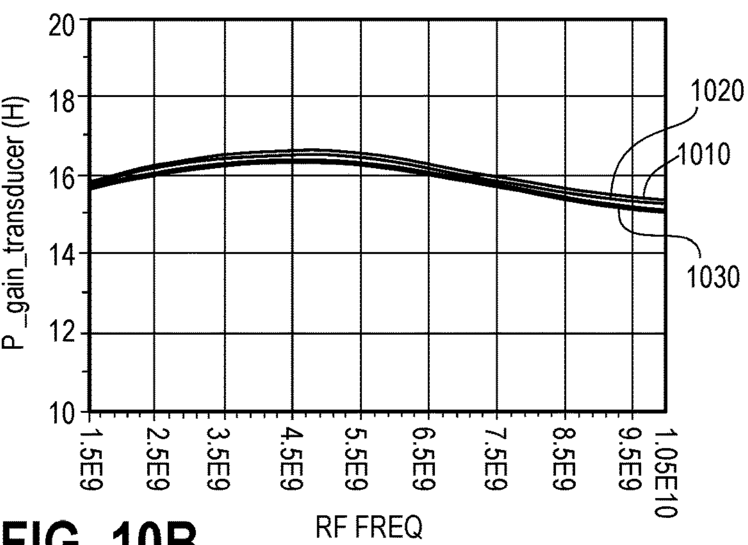
FIGS. 10A-10C, 11A-11C, 12A-12C, 13A-13C, and 14A-14C correspond respectively to FIGS. 9A-9C where the 3 curves in each graph correspond respectively with 3 different values as specified.
Figure 10B:
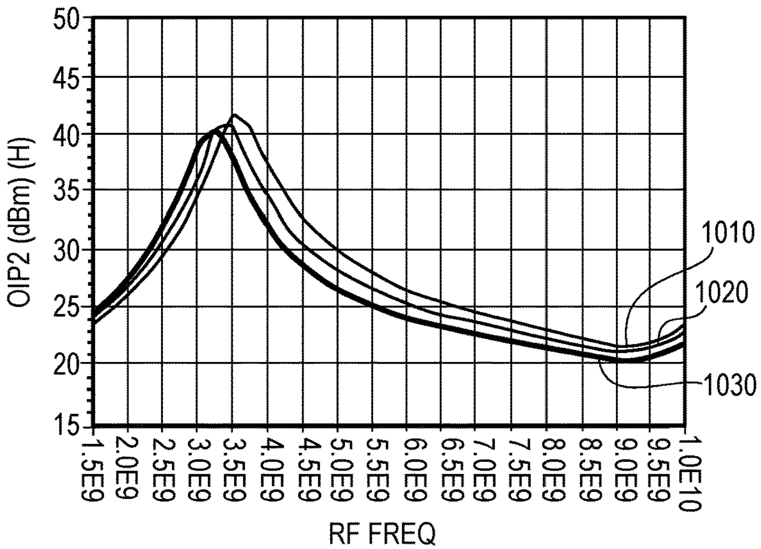
Figure 10C:
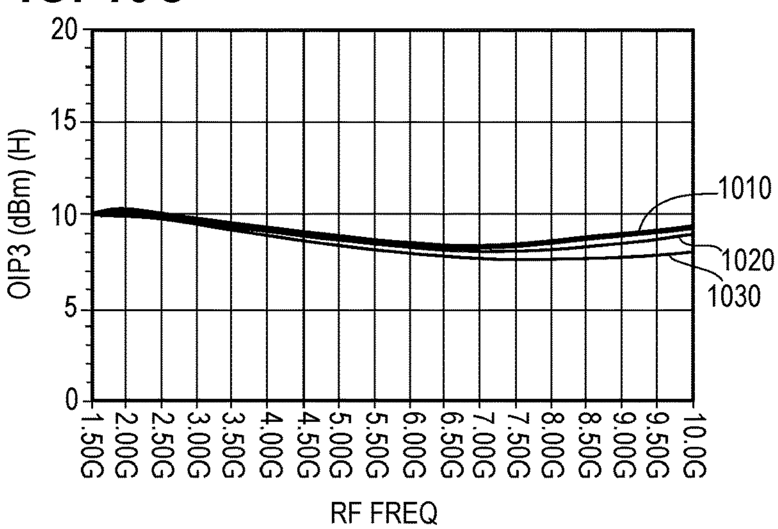

For each of the graphs in FIG. 10, R=100 ohms, Q=30 μm, and Vgs=−0.1 V and C=30 fF. Curves 1010, 1020 and 1030 represent and inductor L value of 1 turn, 1.5 turn and 2 turns, respectively. As seen in FIG. 10B, each of the 3 curves have peaks at approximately 3.5 GHz with only moderate differences in values of OIP2 occurring around the peak values. FIG. 10A shows no difference in gains in FIG. 10C only negligible differences in OIP3 values.

Figure 11A:
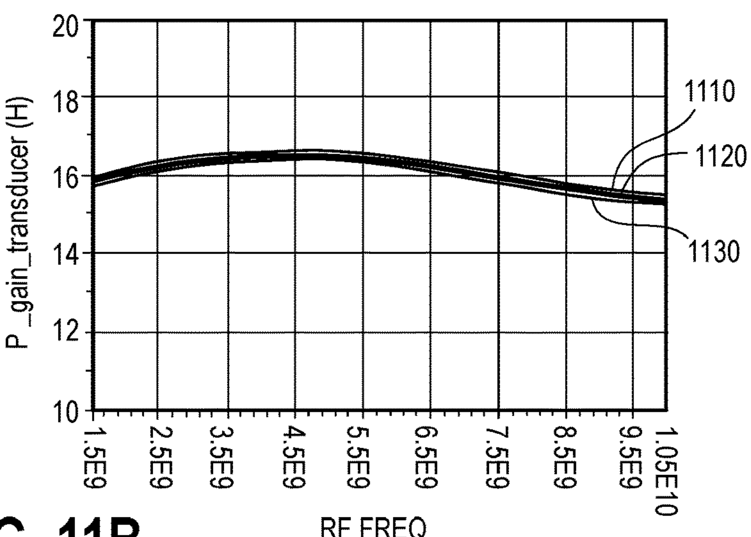
Figure 11B:
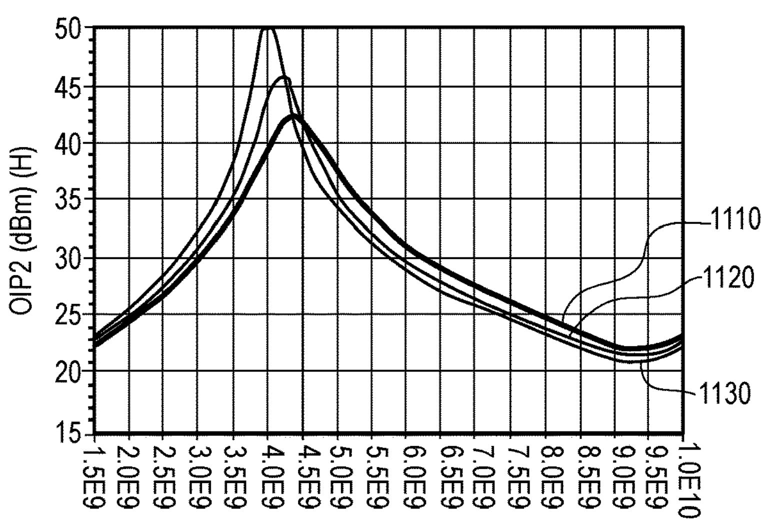
Figure 11C:
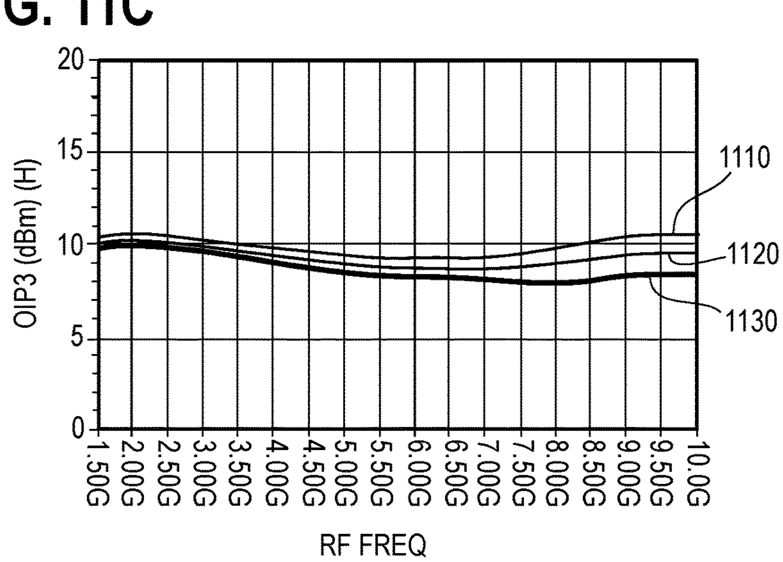

For each of the graphs in FIG. 11, Q=30 um, Vgs=−0.1 V, L=0.26 nH and C=30 fF For FIG. 11, curve 1110 represents R=125 ohms, curve 1120 represents R=100 ohms, and curve 1130 represents R=75 ohms. As will be seen in FIG. 11B, all 3 curves show peaks occurring at about 4 GHz with magnitudes ranging from a little less than −50 dBm, −45 dBm and about −42 dBm. As seen in FIG. 11A, there is no difference in gain across the frequency range. FIG. 11C shows some minor changes, e.g. 2 dBm, between the highest and lowest curve at 10 GHz.

Figure 12A:
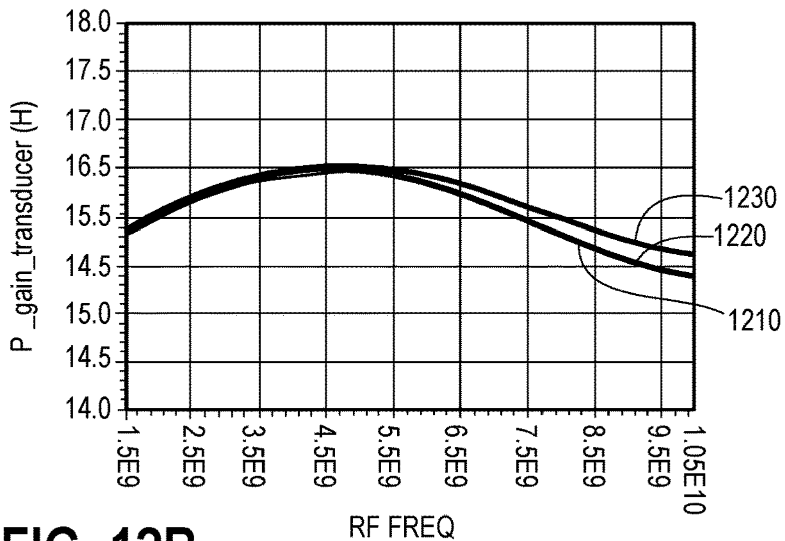
Figure 12B:
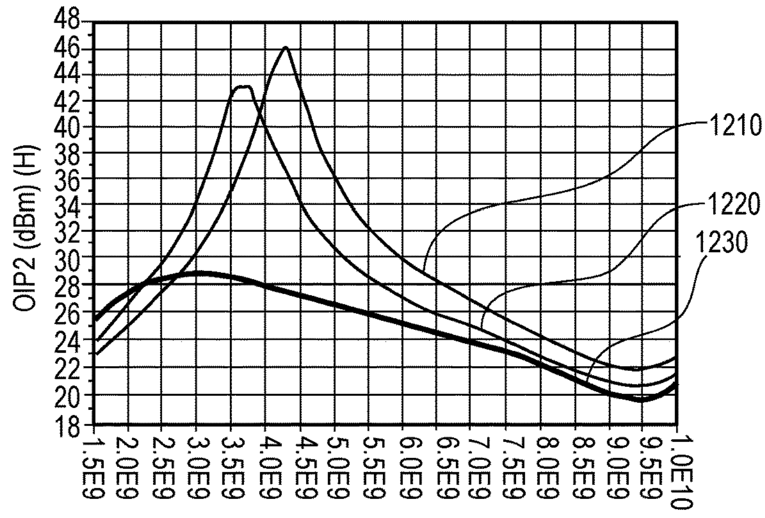
Figure 12C:
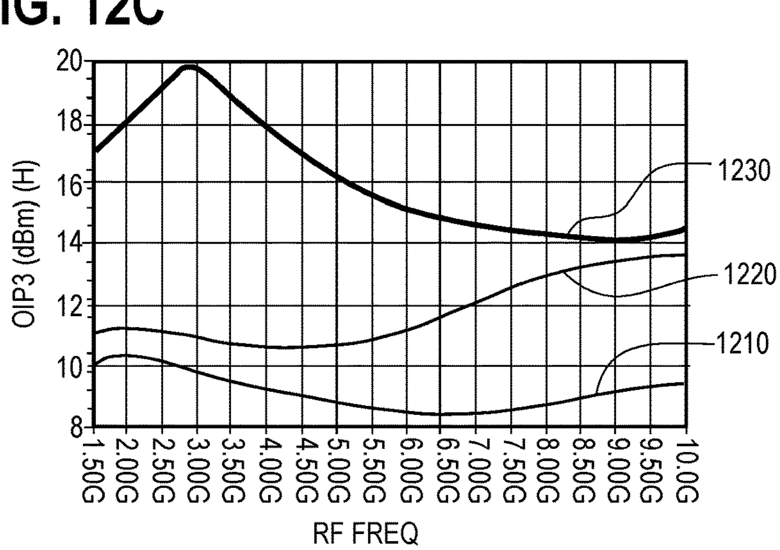

FIG. 12 shows curves having the same fixed elements as described with regard to FIG. 11. However, in FIG. 12 curve 1210 represents R=100 ohms, curve 1220 represents R=200 ohms, and curve 1230 represents R=500 ohms. As seen in FIG. 12B, the peak of curve 1210 at about 4 GHz shows OIP2 at −46 dBm while at the same frequency curve 1230 the value of OIP2 is about −28 dBm. However, as shown in FIG. 12C, there is a very substantial trade-off of OIP3 levels between curves 1210 and 1230. With R=500 ohms (curve 1230), there is a substantial decoupling between PD circuitry 510 and the LNA 505 as evidenced by FIG. 12B showing no substantial peak in OIP2 resulting in worse (larger) values of OIP2 while FIG. 12C shows substantially better (smaller) values of OIP3 as compared with other curves where the resistor has a lower value.

Figure 13A:
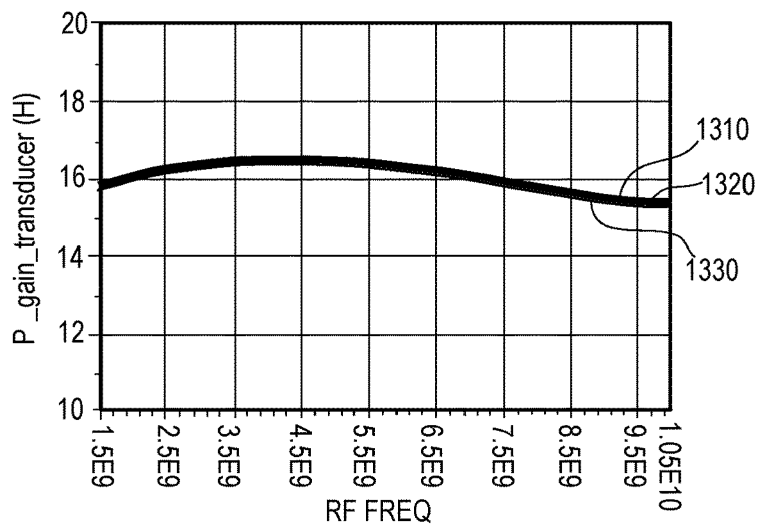
Figure 13B:
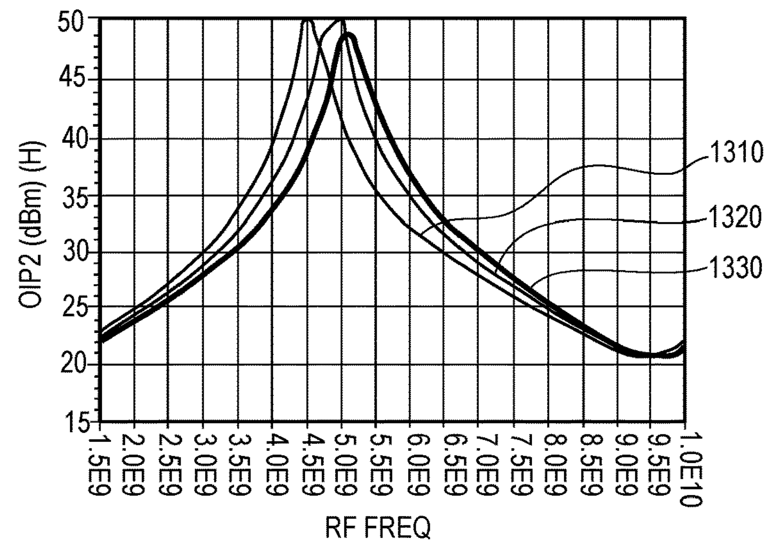
Figure 13C:
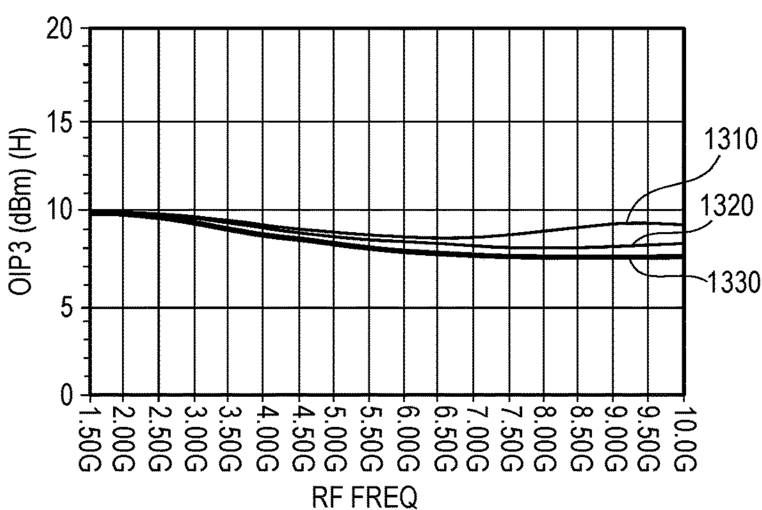

In FIGS. 13, the fixed elements are R=100 ohms, Q=30 um, Vgs=−0.1 V and L=0.26 nH. Different capacitors C provide the variable element with curve 1310 representing C=100 fF, curve 1320 representing C=200 fF, and curve 1330 representing C=300 fF. As seen in FIG. 13B, each the 3 curves show a notable peak at about-50 dBm at approximately 4.5 GHz with the lower tail that tips to approximately-23 dBm at 1.5 GHz and an upper tail that is about-20 dBm at 10 GHz. As seen in FIG. 13C, relatively little differences in OIP3 exists between the 3 curves; FIG. 13A showing no difference in gain among the 3 curves.

Figure 14A:
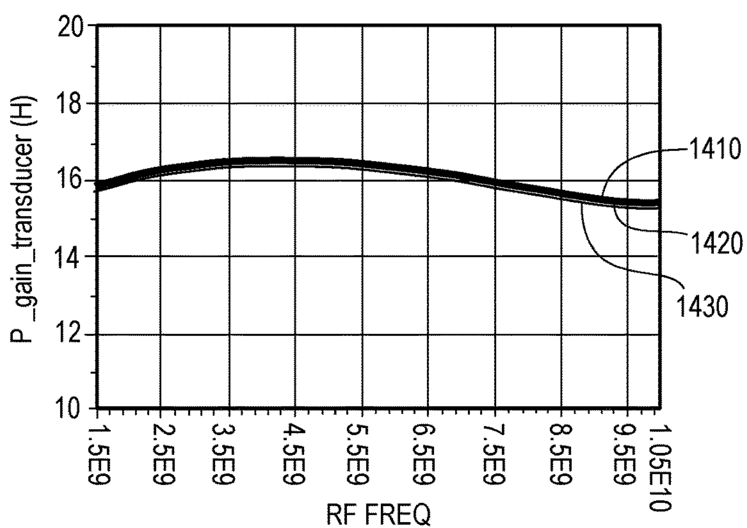
Figure 14B:
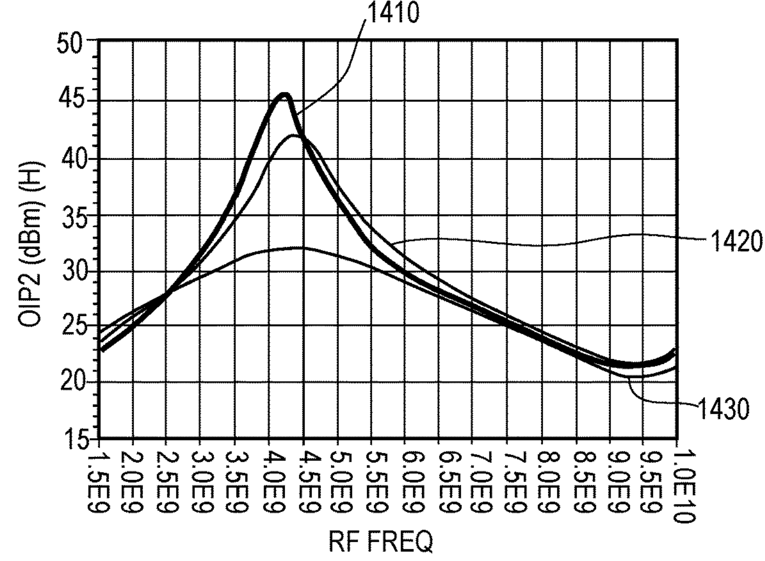
Figure 14C:
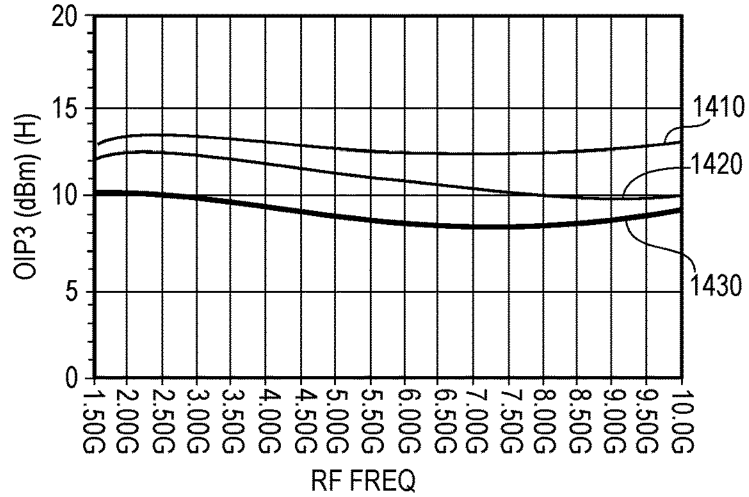

In FIGS. 14, the fixed elements are R=100 ohms, Vgs=−0.1 V, C=30 fF, and L=0.26 nH. Different areas (Q) of device 205, which are generally proportional to gain of the device itself, provide the variable element with curve 1410 representing Q=30 um, curve 1420 representing Q=20 μm, and curve 1430 representing Q=10 um. As seen in FIG. 14B, the device 205 expected to have the largest gain as represented by curve 1410 provides the greatest peak at about −45 dBm at 4 GHz while the device 205 expected to have the smallest gain as represented by curve 1430 has a very mild peak, i.e. a difference of 10 dBm at 4 GHz between curves 1410 and 1430. As seen in FIG. 14C, the higher gain and better performance of OIP2 is a trade-off with larger undesired OIP3 levels. Interestingly, there is no difference in the overall gain as seen in FIG. 14A among the 3 different device areas.

Figure 15:
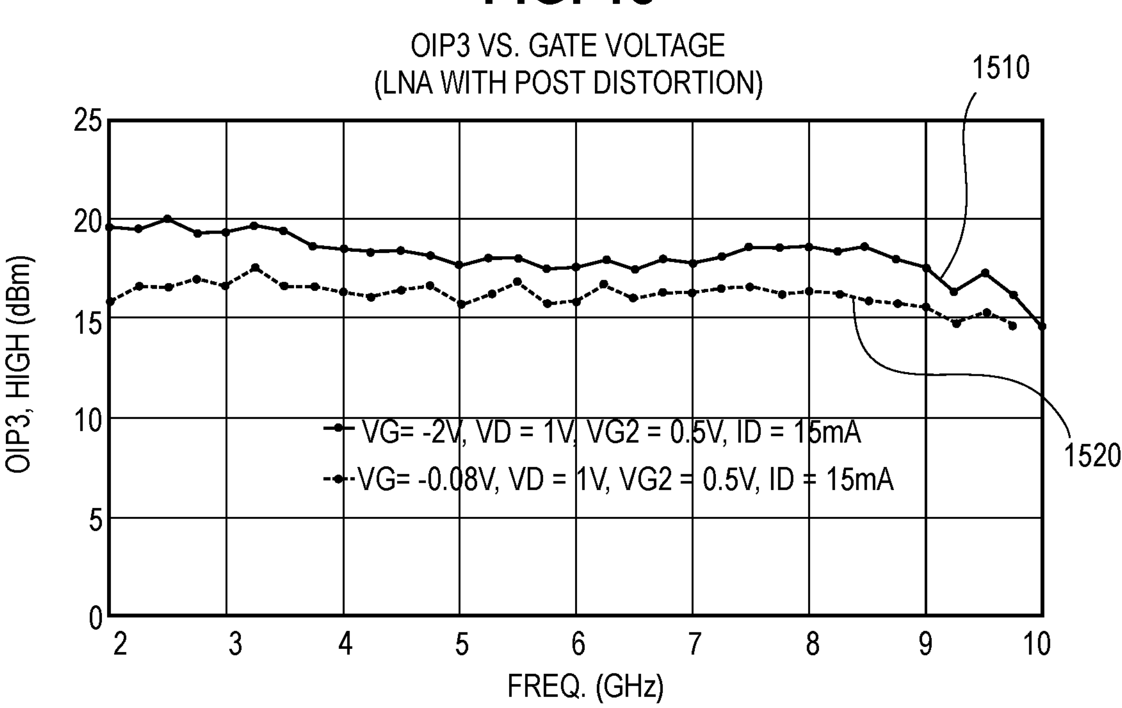
FIG. 15 is a graph of OIP 3 versus frequency for an LNA with post distortion circuit as shown in FIG. 4 where the 2 curves correspond respectively with the 2 different values associated with each.

FIG. 15 is a graph of OIP 3 versus frequency for circuit 500. Curve 1510 represents Vgs of device 205 of −2 V causing device 205 to be in a total pinch-off state so that the PD circuit 510 functions basically as an open circuit. Curve 1520 represents Vgs of device 205 of −0.08 V causing device 205 to operate in a nonlinear region with R=100 ohms, C=0 (no capacitor C), and Q=30 μm. The DC drain to source current through transistor Q2 is 15 mA. The values of curve 1520 show between 4-2 dBm worse performance compared to curve 1510.

Figure 16:
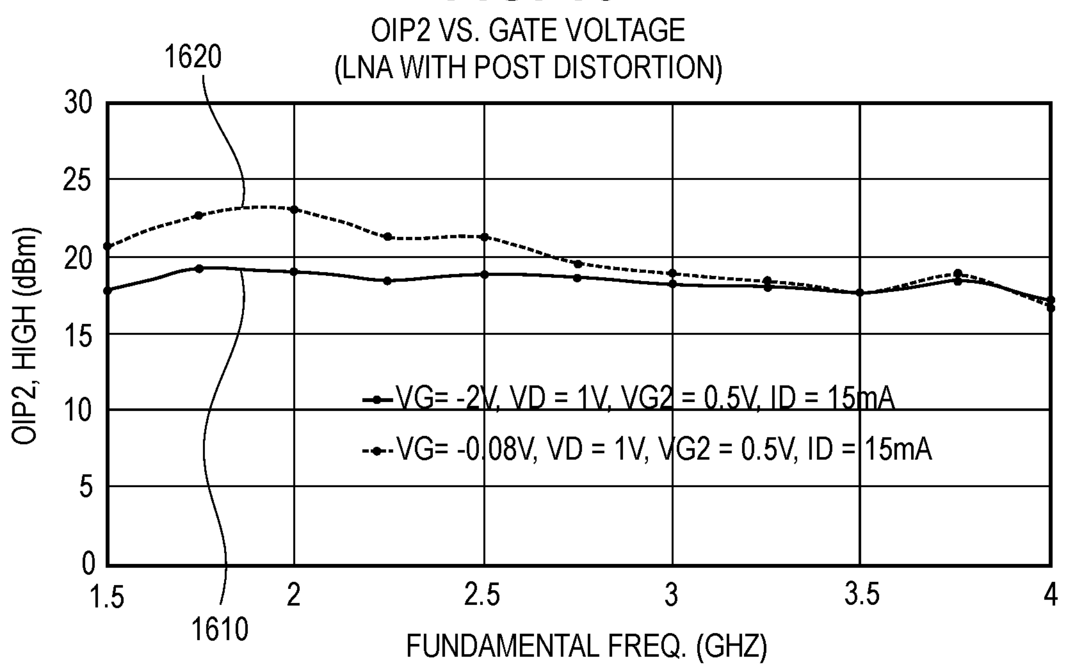
FIG. 16 is a graph of OIP2 versus frequency for an LNA with post distortion circuit as shown in FIG. 4 where the 2 curves correspond respectively with the same 2 different values associated with respective curves in FIG. 15.

FIG. 16 is a graph of OIP 2 versus frequency for circuit 500. Curve 1610 represents Vgs of device 205 of −2 V causing device 205 to be in a total pinch-off state so that the PD circuit 510 functions basically as an open circuit. Curve 1620 represents Vgs of device 205 of −0.08 V causing device 205 to operate in a nonlinear region with R=100 ohms, C=0 (no capacitor C), and Q=30 μm. The DC drain to source current through transistor Q2 is 15 mA. At about 2 GHz curve 1620 provides approximately 5 dBm improvement of OIP2 compared to curve 1610. However, by about 3.5 GHz the 2 curves substantially coincide.

Figures 17, 18:
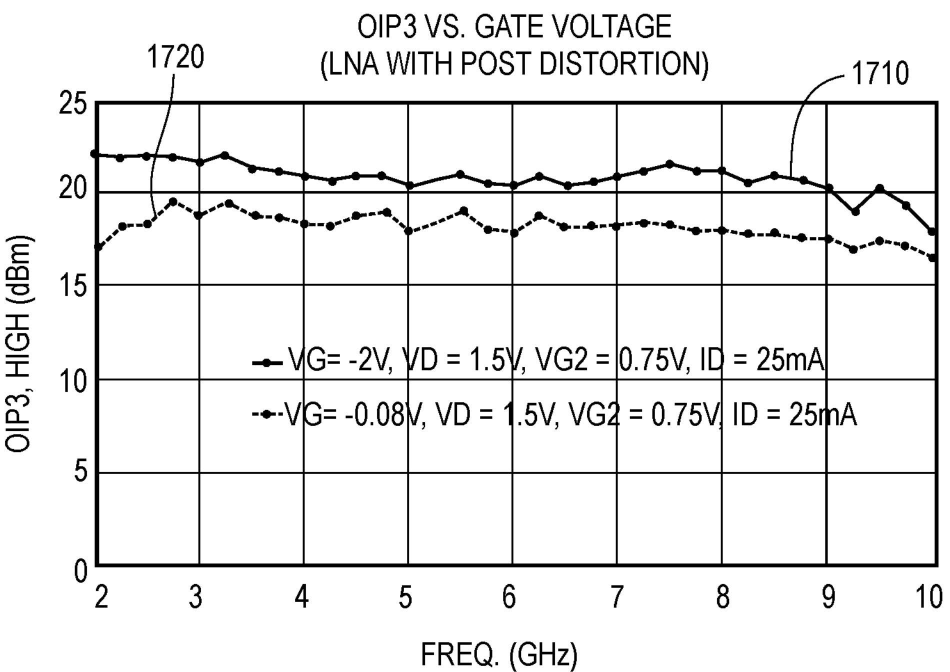
FIG. 17 is a graph of OIP3 versus frequency for an LNA with post distortion circuit as shown in FIG. 4 where the 2 curves correspond respectively with the 2 different values associated with each.
FIG. 18 is a graph of OIP2 versus frequency for an LNA with post distortion circuit as shown in FIG. 4 where the 2 curves correspond respectively with the same 2 different values associated with respective curves in FIG. 17.

FIG. 17 is a graph of OIP 3 versus frequency in which curves 1710 and 1720 represent the same conditions as described for curves 1510 and 1520, respectively, except that the DC drain to source current for Q2=25 mA, not 15 mA as in FIG. 15. In general, both curves in FIG. 17 have a similar shape to the corresponding curves in FIG. 15 and the curves in FIG. 17 have roughly 2 dBm of OIP3 improvement, i.e. smaller OIP3 values.

FIG. 18 is a graph of OIP 2 versus frequency in which curves 1810 and 1820 represent the same conditions as described for curves 1610 and 1620, respectively, except that the DC drain to source current for Q2=25 mA, not 15 mA as in FIG. 16. Curve 1810 at approximately 2 GHz has a value of OIP2 approximately 8 dBm (improved performance) less than the corresponding value at curve 1610. However, curve 1820 has a peak at approximately 2 GHz of an OIP2 value of approximately −50 dBm compared with the corresponding value of curve 1620 that has a value of approximately −24 dBm. This provides a remarkable 2:1 improvement in OIP2. The only difference in conditions between FIG. 16 and FIG. 18 is the biasing of Q2 to have increased Ids of 25 mA as compared to 15 mA. This increase in DC power accommodates a corresponding increase in RF power output by LNA 505. Because the PD circuit 510 utilizes transistor 205 with a Vgs bias set to operate near pinch-off, the increase in RF power coupled to device 205 results in a corresponding increase production of intermodulation products used to cancel the undesired intermodulation products problem LNA 505 at the load. Since the OIP2 product(s) that have the largest negative impact on linearity will typically appear at or near a particular frequency within the desired frequency band of operation, and since the values of the PD circuit inductor L and capacitor C can be selected to move the peak as shown in curve 1820 to different frequencies within the frequency range of operation (e.g., 1-10 GHz in this example), such a 2:1 improvement can be targeted to any OIP2 product within the frequency range of operation. This improvement refers to a reduction of the corresponding original intermodulation product generated by the LNA by at least 50%, and preferably by 100% (the IP being only half its original magnitude).

Figure 19:
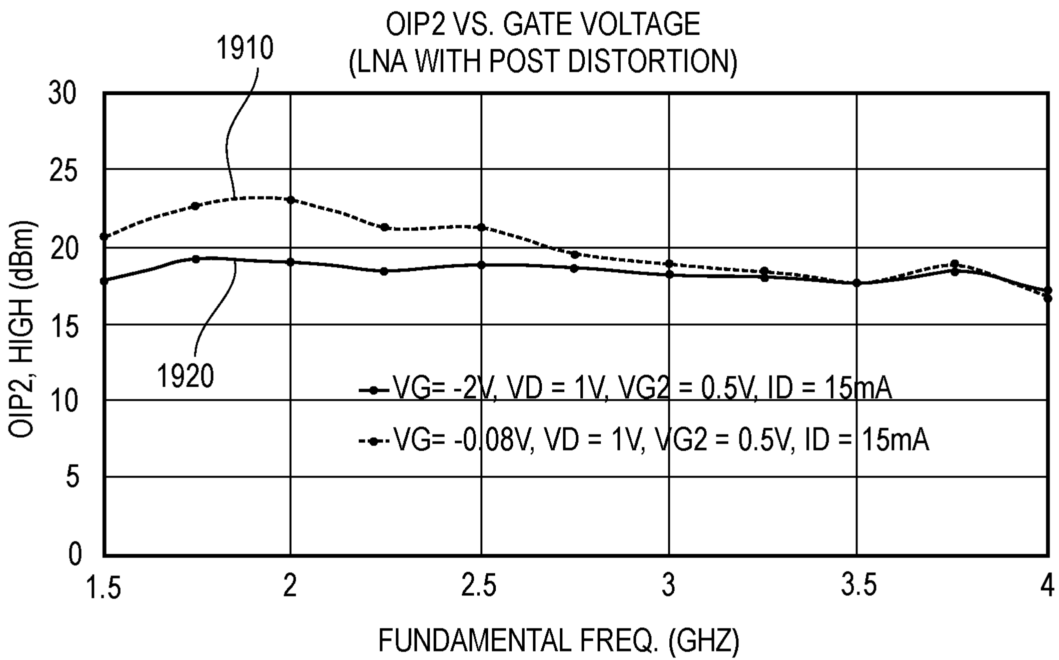
FIGS. 19 and 20 are graphs of OIP2 versus frequency for an LNA with an unequal split of VDS voltage across Q1 and Q2.
Figure 20:
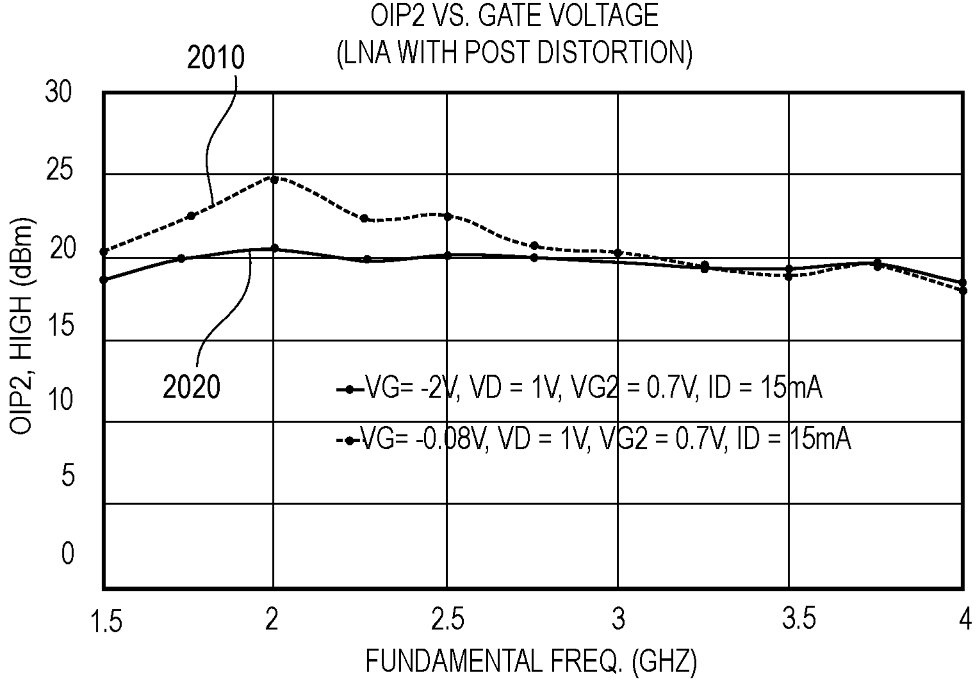

FIGS. 19 and 20 are graphs of OIP2 versus frequency for an LNA illustrating the effects of different splits of VDS voltage across Q1 and Q2, and with PD circuit present. IP2/IP3 trade-offs can be made by adjusting VDS across Q1 and Q2 to be not equal in the main LNA. In FIG. 19, the total drain voltage of 1V is divided 50/50 between Q1 and Q2, i.e., each has VDS of 0.5 volts. The results 1910 is for Vg of −0.08 volts and results 1920 is for Vg of −2.0 volts. In FIG. 20 the total drain voltage is divided 30%/70% between Q1 and Q2, i.e., Q1 has 0.3 volts VDS and Q2 has 0.7 volts VDS. For this condition, it is observed that OIP2 has further improved in FIG. 19. The unequal VDS voltages could range 30%-40% for Q1 and 70%-60% for Q2, and achieve an OIP2 improvement. Since device heat dissipation is a factor for reliability and an excessive amount of heat dissipation for a device is normally to be avoided, a maximum VDS voltage split of about 30%/70% is deemed advisable.

Figure 21:
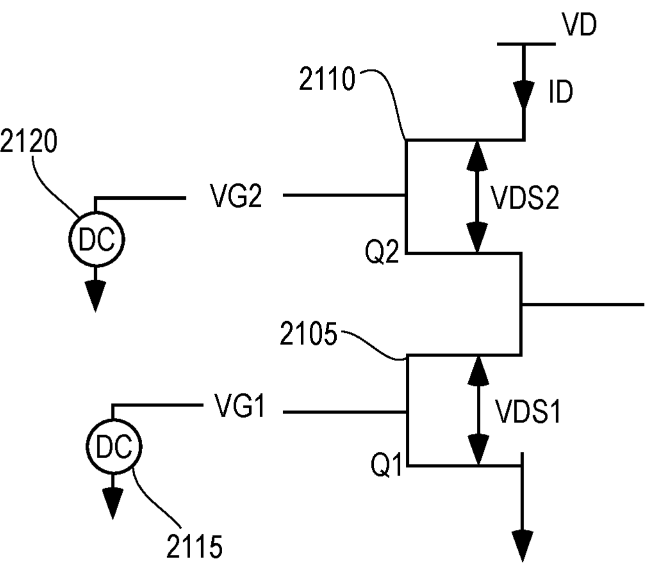
FIG. 21 shows an exemplary dual gate semiconductor functioning as Q1 and Q2 of the LNA.

FIG. 21 shows the dual gate LNA transistors Q1 (2105) and Q2 (2110) with respective gate biasing provided by DC voltage sources 2115 and 2120. As an example of an operating condition, VD=2V and ID=26 mA. As will be described, different biasing of gates VG1 and VG2 provides different, uneven, VDS across each of Q1 and Q2. Such biasing in combination with the PD circuit provides an opportunity for improved OIP2 characteristics.

Figure 22A:
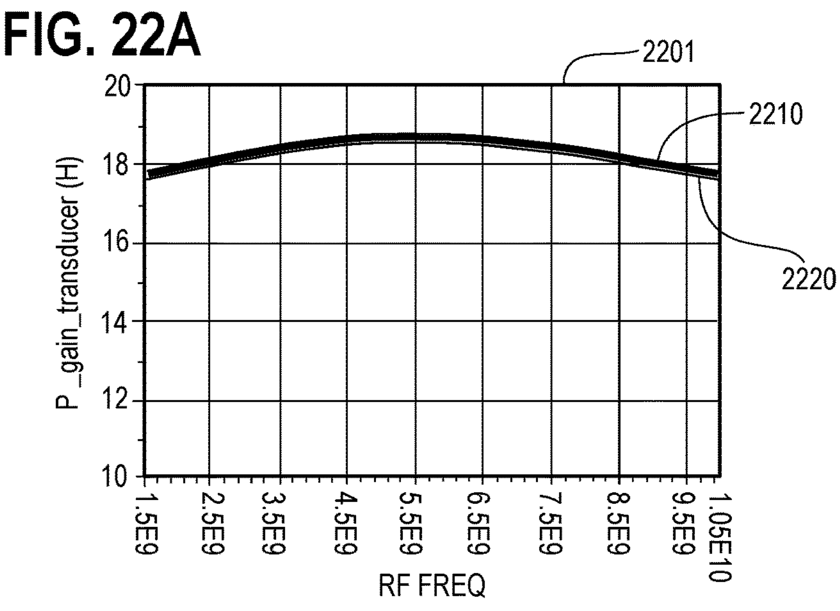
FIGS. 22A, 22B and 22C are graphs of gain, OIP2 and OIP3 performance for a combination of the PD circuit and LNA with Q1 and Q2 biased so that the respective VDS across each are unequal.
Figure 22B:
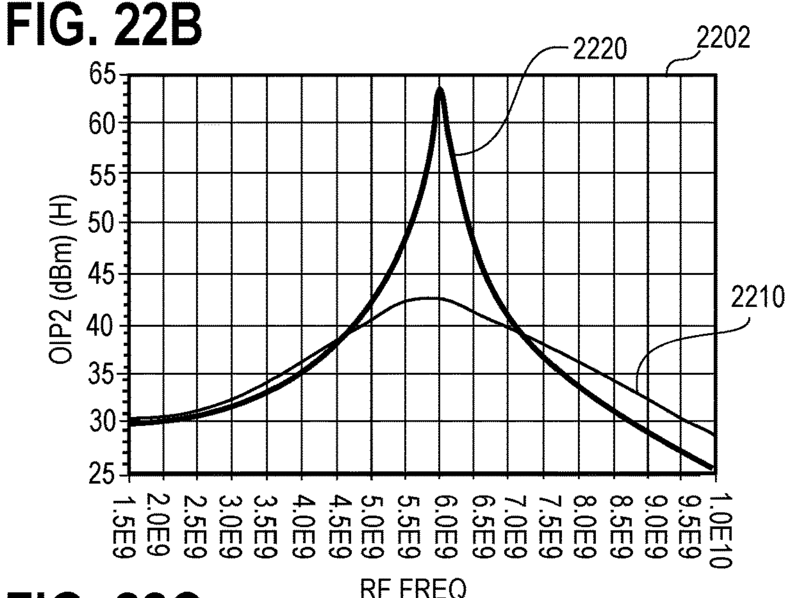
Figure 22C:
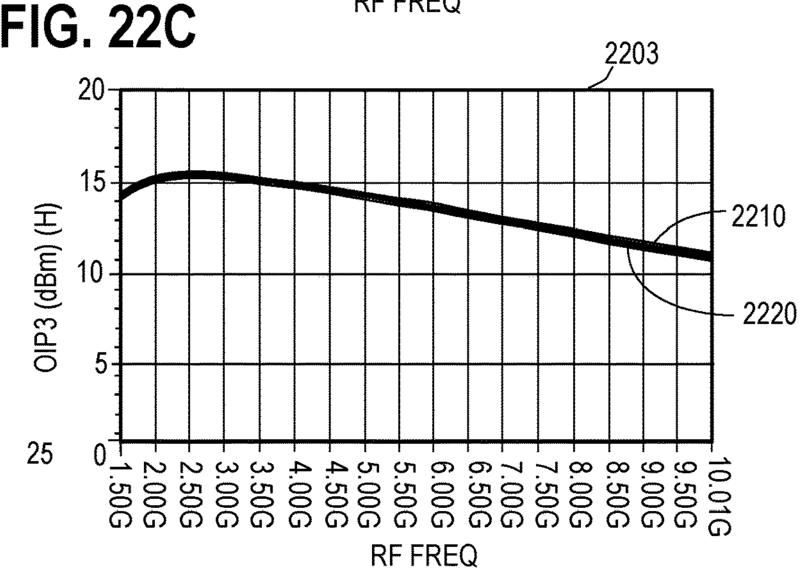

FIGS. 22A-22C are graphs of gain, OIP2 and OIP3 performance for an LNA with Q1 and Q2 biased to have different VDS across each in combination with a PD circuit. Simulated gain and OIP2/OIP3 for the LNA with PD at specified conditions for these PD circuit parameters are: VG=−0.12, R=100 ohms, and Q=30 um. As shown in the graphs 2201, 2202 and 2203, lines 2210 represents characteristics for VG2=1 V, and VG1=0.12 V for Q2 and Q1, respectively, and lines 2220 represents characteristics for VG2=1.4V, and VG1=0.11 V for Q2 and Q1, respectively. Graph 2201 shows that the gains for these two conditions are substantially the same. Likewise, graph 2203 shows that the OIP3 characteristics for these two conditions are substantially the same. However, graph 2202 for the OIP2 characteristics are notably different for these two conditions. At 6 GHz line 2210 is about 42 dBm while line 2220 is about 64 dBm, i.e. 22 dBm of improvement in OIP3. It is important to note that 10 dB represents a 10$x$ difference and that 20 dB represent a 100$x$ difference. Although this amount of advantage is not maintained across the entire frequency range, the frequency at which the maximum advantage (peak) occurs can be varied to a desired location within the range of frequencies by proper selection of values of L, C and R; see FIG. 5. This peak can be located at a particular frequency within the range that has particular significance to maximize OIP2 performance. The PD circuit parameters remained the same for these two conditions.

Excellent linearity is a desirable attribute for an LNA. Linearity is quantified by the amount of intermodulation products such as IM2 and IM3 in the output of an LNA and by intercept points IP2/IP3.

the "nonlinear" region for the active device.

Although exemplary implementations of the invention have been depicted and described in detail herein, it will be apparent to those skilled in the art that various modifications, additions, substitutions, and the like can be made without departing from the spirit of the invention. For example, the number and types of active devices used in the LNA can vary. Also, the type of active device used in the PD circuit could be other than a FET, as long as the active device is operated in a nonlinear region. For example, a PD circuit could be made using MOSFET devices or BJT devices. Although the exemplary PD circuit is only AC coupled to the LNA so that no DC current from the LNA is used by the PD circuit, a DC coupling could be used if DC power used by the LNA is not a significant concern.

Although the PD circuit may advantageously be manufactured on the same semiconductor wafer as the LNA, the PD circuit could be connected as an external circuit to the chip containing the LNA.

The scope of the invention is defined in the following claims.

The invention claimed is:

1. An RF amplifier circuit operating within a range of frequencies comprising:

a low noise amplifier producing RF signals on an output;

a load coupled to the output to receive the RF signals, wherein the low noise amplifier comprises first and second transistors operating as a dual gate device, wherein a bias circuit causes a DC quiescent voltage across the gate of the first transistor to be 30% to 40% of a total gate voltage across both transistors to reduce a second order intermodulation product;

a post distortion (PD) circuit having a semiconductor device with a control gate biased to cause the semiconductor device to operate in a nonlinear region at or near pinch-off, wherein active devices in the semiconductor device are high electron mobility transistors (HEMT) having indium arsenide composite channel (IACC) technology;

the PD circuit having a PD port that is coupled to the output of the low noise amplifier;

the PD circuit generating at least one PD intermodulation product at the PD port in response to the RF signals being received from the low noise amplifier through a coupling by the PD circuit, the at least one PD intermodulation product being out of phase to an intermodulation product produced by the low noise amplifier that is present at the output; and the at least one PD intermodulation product combining with the intermodulation product produced by the low noise amplifier to cause a reduction of the intermodulation product at the load by at least 10 dB for at least one frequency in the range of frequencies.

2. The RF amplifier circuit of claim 1 further comprising the PD circuit being coupled to the low noise amplifier only by an AC coupling so that no DC power used by the low noise amplifier is utilized by the PD circuit.

3. The RF amplifier circuit of claim 1 wherein the at least one PD intermodulation product and the intermodulation product produced by the low noise amplifier are each second order intermodulation products.

4. The RF amplifier circuit of claim 1 further comprising a DC bias circuit, coupled to the control gate of an active semiconductor device of the PD circuit, provides a biasing voltage that establishes a DC quiescent point at or near pinch-off of the active semiconductor device.

5. The RF amplifier circuit of claim 1 wherein active devices in the low noise amplifier are high electron mobility transistors (HEMT) having indium arsenide composite channel (IACC) technology.

6. The RF amplifier circuit of claim 1 further comprising a resistor in series between the PD port and the output of the low noise amplifier, where a value of the resistor determines an amount of coupling between the PD circuit and the output of the low noise amplifier.

7. The RF amplifier circuit of claim 1 further comprising at least one of an inductor and a capacitor connected between the PD port and the output of the low noise amplifier, where a value of the at least one inductor and capacitor contributes to determining a frequency with the range of frequencies where a maximum reduction of the intermodulation product at the load occurs.

8. The RF amplifier circuit of claim 1 further comprising an inductor and a capacitor connected between the PD port and the output of the low noise amplifier, where values of the inductor and capacitor contributes to determining a frequency with the range of frequencies where a maximum reduction of the intermodulation product at the load occurs.

9. The RF amplifier circuit of claim 1 wherein the unequal DC quiescent voltages across the first and second transistors causing a reduction of a second intermodulation product produced by the first and second transistors as compared with a second intermodulation product that would be produced by the first and second transistors operating with equal DC quiescent voltages across the first and second transistors.

10. An improvement for an RF amplifier circuit operating within a range of frequencies having a low noise amplifier producing RF signals on an output and a load coupled to the output to receive the RF signals, the improvement comprising:

a post distortion (PD) circuit having a semiconductor device with a control gate biased to cause the semiconductor device to operate in a nonlinear region at or near pinch-off, wherein active devices in the semiconductor device are high electron mobility transistors (HEMT) having indium arsenide composite channel (IACC) technology;

the PD circuit having a PD port that is coupled to the output of the low noise amplifier;

the PD circuit generating at least one PD intermodulation product at the PD port in response to the RF signals being received from the low noise amplifier through a coupling by the PD circuit, the at least one PD intermodulation product being out of phase to an intermodulation product produced by the low noise amplifier that is present at the output; and the at least one PD intermodulation product combining with the intermodulation product produced by the low noise amplifier to cause a reduction of the intermodulation product at the load by at least 10 dB for at least one frequency in the range of frequencies, wherein the low noise amplifier comprises first and second transistors operating as a dual gate device, wherein a bias circuit causes a DC quiescent voltage across the gate of the first transistor to be 30% to 40% of a total gate voltage across both transistors to reduce a second order intermodulation product.

11. The improvement of claim 10 further comprising the PD circuit being coupled to the low noise amplifier only by an AC coupling so that no DC power used by the low noise amplifier is utilized by the PD circuit.

12. The improvement of claim 10 wherein the at least one PD intermodulation product and the intermodulation product produced by the low noise amplifier are each second order intermodulation products.

13. The improvement of claim 10 further comprising the DC bias circuit, wherein the DC bias circuit is coupled to the control gate of an active semiconductor device of the PD circuit and provides a biasing voltage that establishes a DC quiescent point substantially at or near pinch-off of the active semiconductor device.

14. An RF amplifier circuit operating within a range of frequencies comprising:

a low noise amplifier producing RF signals including a second order intermodulation product on an output;

a load coupled to the output to receive the RF signals and second order intermodulation product;

the low noise amplifier having first and second transistors operating as a dual gate device;

a bias circuit coupled to the first and second transistors establishes a DC quiescent voltage across each of the first and second transistors with the sum of the DC quiescent voltages across the first and second transistors being a total voltage;

the bias circuit causing the DC quiescent voltage across the first transistor to be 30% to 40% of the total voltage and the DC quiescent voltage across the second transistor to be 70%-60%, respectively, of the total voltage; and the unequal DC quiescent voltages across the first and second transistors causing a reduction of the second intermodulation product produced by the first and second transistors as compared with a second intermodulation product produced by the first and second transistors operating with equal DC quiescent voltages across the first and second transistors.

15. The improvement of claim 10 further comprising a resistor in series between the PD port and the output of the low noise amplifier, where a value of the resistor determines an amount of coupling between the PD circuit and the output of the low noise amplifier.

16. The improvement of claim 10 further comprising at least one of an inductor and a capacitor connected between the PD port and the output of the low noise amplifier, where a value of the at least one inductor and capacitor contributes to determining a frequency with the range of frequencies where a maximum reduction of the intermodulation product at the load occurs.

17. The improvement of claim 10 further comprising an inductor and a capacitor connected between the PD port and the output of the low noise amplifier, where values of the inductor and capacitor contributes to determining a frequency with the range of frequencies where a maximum reduction of the intermodulation product at the load occurs.

18. The RF amplifier circuit of claim 14 further comprising:

a post distortion (PD) circuit having a semiconductor device with a control gate biased to cause the semiconductor device to operate in a nonlinear region at or near pinch-off;

the PD circuit having a PD port that is AC coupled to the output of the low noise amplifier;

the PD circuit generating a second order PD intermodulation product at the PD port in response to the RF signals being received from the low noise amplifier through an AC coupling by the PD circuit, the second order PD intermodulation product being out of phase to a second order intermodulation product produced by the low noise amplifier that is present at the output; and the second order PD intermodulation product combining with the second order intermodulation product produced by the low noise amplifier to cause a reduction of the second order intermodulation product at the load by at least 10 dB for at least one frequency in the range of frequencies.

19. The RF amplifier circuit of claim 18 further comprising a DC bias circuit, coupled to the control gate of an active semiconductor device of the PD circuit, provides a biasing voltage that establishes a DC quiescent point substantially at or near pinch-off of the active semiconductor device.

* * * * *